United States Patent
Piirainen

(10) Patent No.: US 6,173,302 B1
(45) Date of Patent: Jan. 9, 2001

(54) DECIMATION METHOD AND DECIMATION FILTER

(75) Inventor: Olli Piirainen, Oulu (FI)

(73) Assignee: Nokia Telecommunications Oy, Espoo (FI)

( * ) Notice: Under 35 U.S.C. 154(b), the term of this patent shall be extended for 0 days.

(21) Appl. No.: 09/117,318
(22) PCT Filed: Dec. 3, 1997
(86) PCT No.: PCT/FI97/00753
   § 371 Date: Jul. 27, 1998
   § 102(e) Date: Jul. 27, 1998
(87) PCT Pub. No.: WO98/25342
   PCT Pub. Date: Jun. 11, 1998

(30) Foreign Application Priority Data

Dec. 4, 1996 (FI) ................................ 964860

(51) Int. Cl.[7] .................................. G06F 17/17
(52) U.S. Cl. ..................................... 708/313
(58) Field of Search ....................... 208/300, 313, 208/319, 290

(56) References Cited

U.S. PATENT DOCUMENTS 5,689,449 * 11/1997 Saramaki et al. .................. 708/313
5,751,615 * 5/1998 Brown ............................... 708/313
5,777,908 * 7/1998 Inogai .............................. 708/313

FOREIGN PATENT DOCUMENTS

| 2180114 | 3/1987 | (GB) . |
| 2258963 | 2/1993 | (GB) . |
| WO 94/23493 | 10/1994 | (WO) . |
| WO 9423492 | 10/1994 | (WO) . |
| WO 95/10883 | 4/1995 | (WO) . |

OTHER PUBLICATIONS

Apr. 1981, Hogenauer, *IEEE Transactions on Acoustics, Speech, and Signal Processing*, vol. ASSP–29, No. 2, "An Economical Class of Digital Filters for Decimation and Interpolation", pp. 155–162.

* cited by examiner

Primary Examiner—Chuong Dinh Ngo
(74) Attorney, Agent, or Firm—Altera Law Group, LLC

(57) ABSTRACT

The invention relates to a decimation method and a decimation filter, which provide the transfer function of a CIC decimation filter. Decimation of the number of order N is performed by coefficient M, whereby FIR filtering is carried out in the main branch (100) of the decimation filter by M-tap FIR filters (20) N times in sequence, decimation is carried out by decimation means (21) by coefficient M and comb-filtering is carried out by means (22) N−1 times. The effect of sample cycles M preceding the sample cycle M to be processed is taken into account by using side branches (101, 102, 104) and additional branches (103, 105, 106, 107).

15 Claims, 4 Drawing Sheets

US 6,173,302 B1

DECIMATION METHOD AND DECIMATION FILTER

FIELD OF THE INVENTION

The invention relates to a decimation method, the transfer function of which substantially corresponds to the transfer function of a CIC decimation filter, and in which a signal including digital samples is decimated by coefficient M.

The invention also relates to a decimation filter, the transfer function of which substantially corresponds to the transfer function of a CIC decimation filter, and which is arranged to decimate a signal including digital samples by coefficient M.

BACKGROUND OF THE INVENTION

Digital signal processing comprises several applications in which sampling should be changeable. In decimation, the sampling period is increased, whereby the sampling frequency decreases. This allows to reduce the number of data points processed or stored in the memory per a time unit.

In a receiver of the radio system, for example, an analogue/digital conversion is carried out on a pass band signal by using a high sampling frequency. After the A/D conversion the frequency of the pass-band signal is decreased to the level of the base band, but the sampling frequency still remains high. Excessive sampling can be reduced by using a decimation filter, which also improves the signal-to-noise ratio.

A CIC decimation filter (Cascaded Integrator-Comb), for example, is a conventional decimation filter, which reduces sampling of a signal by a high coefficient. The CIC filter comprises a number of integrators in serial form, a decimation part and a number of successive comb filters. Such a filter can be implemented e.g. by using adder/subtractor structures, and thus it can be used at high frequencies. With respect to a more detailed description of the solution a reference is made to An Economical Class of Digital Filters for Decimation and Interpolation, E. B. Hogenauer.

A problem associated with the decimation filter employing integrators is that the long-term expected value of input data has to be zero, i.e. the data must not contain any DC offset. Even a minor DC offset in the input data causes overloading of integrators, and a functional error in the decimation filter. In order to avoid the DC offset, twos complement arithmetic or the like is used, comprising deducing positive and negative numbers from one another by means of a simple bit exchange. The problem can also be diminished by increasing the word length of the decimation filter, but as such this does not eliminate the problem.

BRIEF DESCRIPTION OF THE INVENTION

An object of the present invention is to provide decimation filtering and a decimation filter which realize the transfer function of a CIC decimation filter, but which function without becoming overloaded even when the expected value of input data deviates from zero.

This is achieved with the method described in the introduction. The method is characterized in that at least main processing is performed on the signal to be decimated, the main processing comprising the steps of performing M-tap FIR filtering N times in sequence, decimating by coefficient M and comb-filtering the signal N−1 times.

The decimation filter of the invention is characterized in that it at least comprises a main branch, which comprises decimation means, which decimate by coefficient M, N M-tap FIR filters in sequence before the decimation means of the main branch, and N−1 combinations of a comb filter and an adder in sequence after the main branch of the decimation means.

The decimation filter of the invention is also characterized in that it at least comprises a main branch, which comprises decimation means, N M-tap FIR filters before the decimation means of the main branch, which decimate by coefficient M; and if the number N of M-tap FIR filters is more than one, the decimation filter is arranged to take into account N−1 sample cycles M preceding the incoming sample cycle M, and thus, in addition to the main branch, the decimation filter comprises selection means; memory; shift means; adder/subtractor means and control means; N−1 side branches, the divergence point of which is operationally connected between each of two FIR filters before the decimation means of the main branch, and their other end is operationally connected to the selection means, the side branches comprising decimation means for decimating the signal coming to the side branch by coefficient M; delay means for delaying the decimated signal by one M sample cycle; additional branches comprising delay means for delaying the signal by one sample cycle M, the divergence point of the additional branches being operationally connected after each delay means in the side branch or additional branch, and their other end being operationally connected to the selection means; the selection means of the decimation filter are arranged to select one signal at a time from the main branch, side branch or additional branch for an arithmetic shift operation for the shift means; the shift means of the decimation filter are arranged to perform necessary arithmetic shift on each signal of the main branch, side branch or additional branch; the adder/subtractor means of the decimation filter are arranged to calculate the difference of signals according to comb-filtering and to add the signal of each side branch or additional branch to the result provided; the memory of the decimation filter is arranged to store the results provided for the signals of each main branch, side branch and additional branch and the sums of the results; the control means of the decimation filter are arranged to control the function of the decimation filter so that the decimation filter substantially provides the transfer function of the CIC decimation filter.

The method of the invention provides several significant advantages. Overload situations due to the DC offset of the decimation filter can be avoided and hence the filter will function more reliably in all circumstances. Furthermore, arithmetic to be used in decimation can be selected freely.

BRIEF DESCRIPTION OF THE DRAWINGS

In the following, the invention will be described in greater detail with reference to the accompanying drawings, in which.

DETAILED DESCRIPTION OF THE INVENTION

The invented solution can be applied to a receiver of the radio system and used for decreasing the sample frequency of a received signal and for reducing the number of data points; however, the invention is not limited only to this application. The transfer function H(z) of the prior art CIC decimation filter comprising integrators and comb filters can be expressed in its z transformation form as follows:

$$H(z) = [(1-z^{-M})/(1-z^{-1})]^N \quad (1)$$

where z is a variable, M is the decimation coefficient, N is the number of order (number of integrators and comb-filtering stages). In the invented solution the transfer function of the CIC decimation filter is provided without using integrators.

Figure 1:
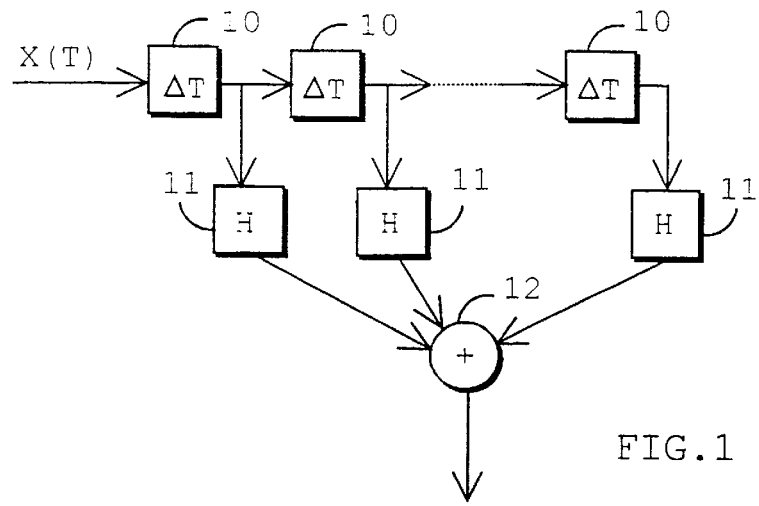
FIG. 1 is a block diagram illustrating a FIR filter.

First, the structure and function of sub-components of the decimation filter according to the invention will be viewed briefly. FIG. 1 illustrates a block diagram of a FIR filter comprising delay means 10, taps 11, i.e. intermediate samples, and an adder 12. The taps 11 of the M-tap FIR filter of the invention are preferably ones, that is, the taps 11 are not weighted. In that case, the incoming signal x (t) is delayed in each delay means 10, and the delayed signals are added together in the adder 12. At its simplest the FIR filter is a shift register, the contents of each register element of which are added as weighted by the tap coefficient. In the time domain the output y (t) of the FIR filter can be expressed by the following formula $$y(t) = \sum_{k=0}^{M-1} h(k) \times (t - k\Delta t), \quad (2)$$

where h (k) is the tap coefficient, Δt is delay and x is a variable.

In a comb filter, on the other hand, a signal is fed into the delay component, which delays the signal by a known amount, and after this the signal delayed in the delay component is added to or subtracted from the original signal. When the delayed signal is subtracted from the original signal, the zeros will be located at frequencies f and their multiples 2f, 3f, etc. Zeros allow to diminish problems caused by aliasing. The decimation means, decimating by coefficient M, is a switch or the like, which samples each Mth sample.

In the following, the structure and function of the decimation filter of the invention will be described in greater detail. The basic idea of the invention is that integrators used in the prior art CIC decimation filter decimating by coefficient M are replaced with M-tap FIR filters, the taps of which are preferably weighted so that they have the same value. The taps are preferably ones. A decimation filter of the first degree can be preferably implemented by one M-tap FIR filter and decimation means which decimate by coefficient M.

Figure 2:
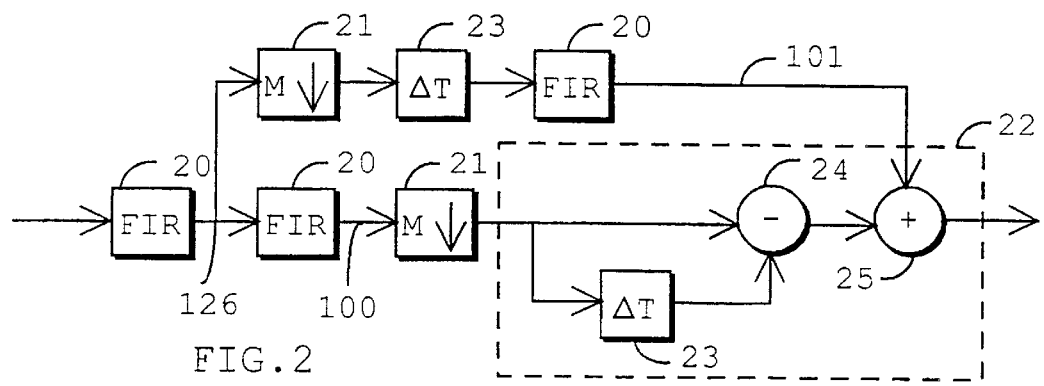
FIG. 2 is a block diagram illustrating a decimation filter of the 2nd degree, FIG. 3 a block diagram illustrating a decimation filter of the 3rd degree.

FIG. 2 illustrates a decimation filter of the second degree. At the divergence point 126 between two FIR filters 20 there is a side branch 101 branching from the main branch 100, carrying out the main processing of the decimation filter and comprising two FIR filters 20, decimation means 21 and a combination 22 of a comb filter and an adder, so that the preceding sample cycle M comprising M samples could be appropriately taken into account in decimation filtering. The side branch also comprises decimation means 21, delay means 23 and a FIR filter 20. The combination 22 of a comb filter and an adder comprises delay means 23, a subtractor 24 and an adder 25.

Figure 3:
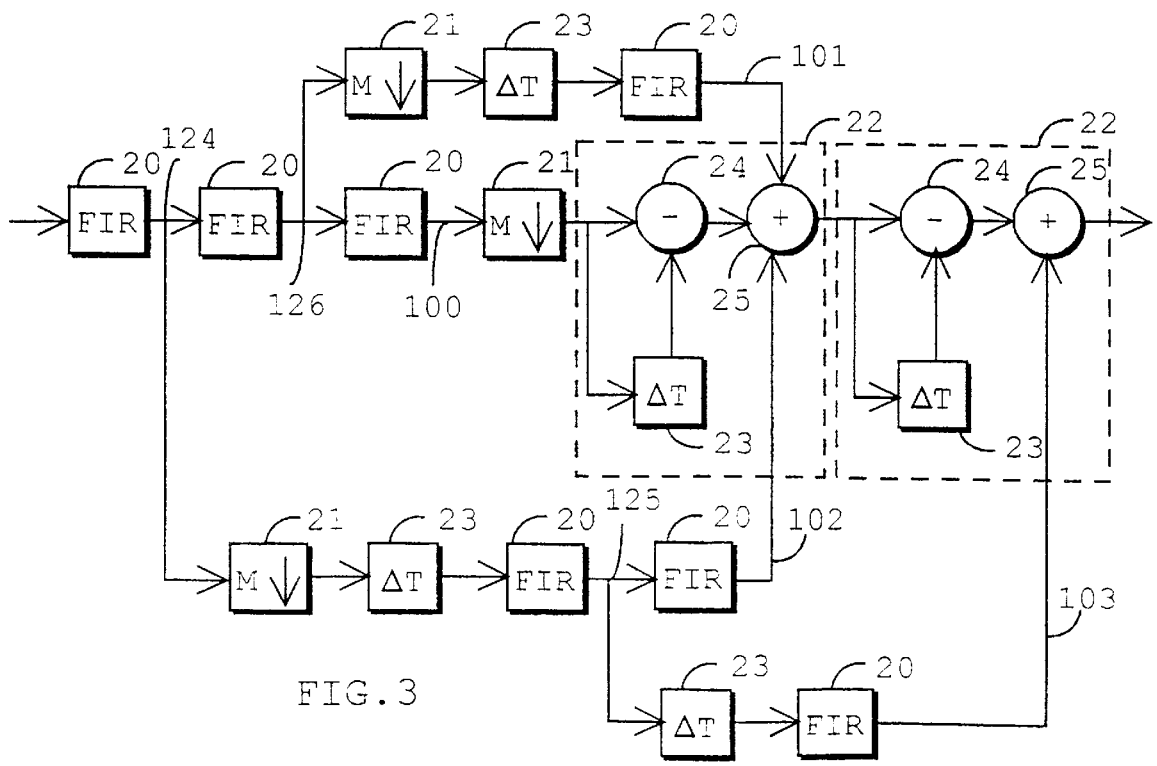

FIG. 3 illustrates a decimation filter of the third degree of the invention. The main branch 100 comprises three FIR filters 20, decimation means 21 and two combinations 22 of a comb filter and an adder. There are two side branches, which perform a first additional processing (decimation, delaying and FIR filtering). Of these, the side branch 101 is similar to the side branch illustrated in FIG. 2. The side branch 102 branches from the divergence point 124 and comprises decimation means 21, delay means 23 and two FIR filters 20. Furthermore, an additional branch 103 branches from the side branch 102 at the divergence point 125 between two FIR filters 20. The additional branch carries out delaying and FIR filtering by means of the delay means 23 and FIR filter 20 according to the second additional processing. In other words, the structure is characterized in that there is a new branch (side branch or additional branch) branching from between each of two FIR filters 20, the branch comprising at least one delay means 23 and FIR filter. The side branch further comprises decimation means 21 so that decimation could be carried out in each branch branching from the main branch.

Figure 4:
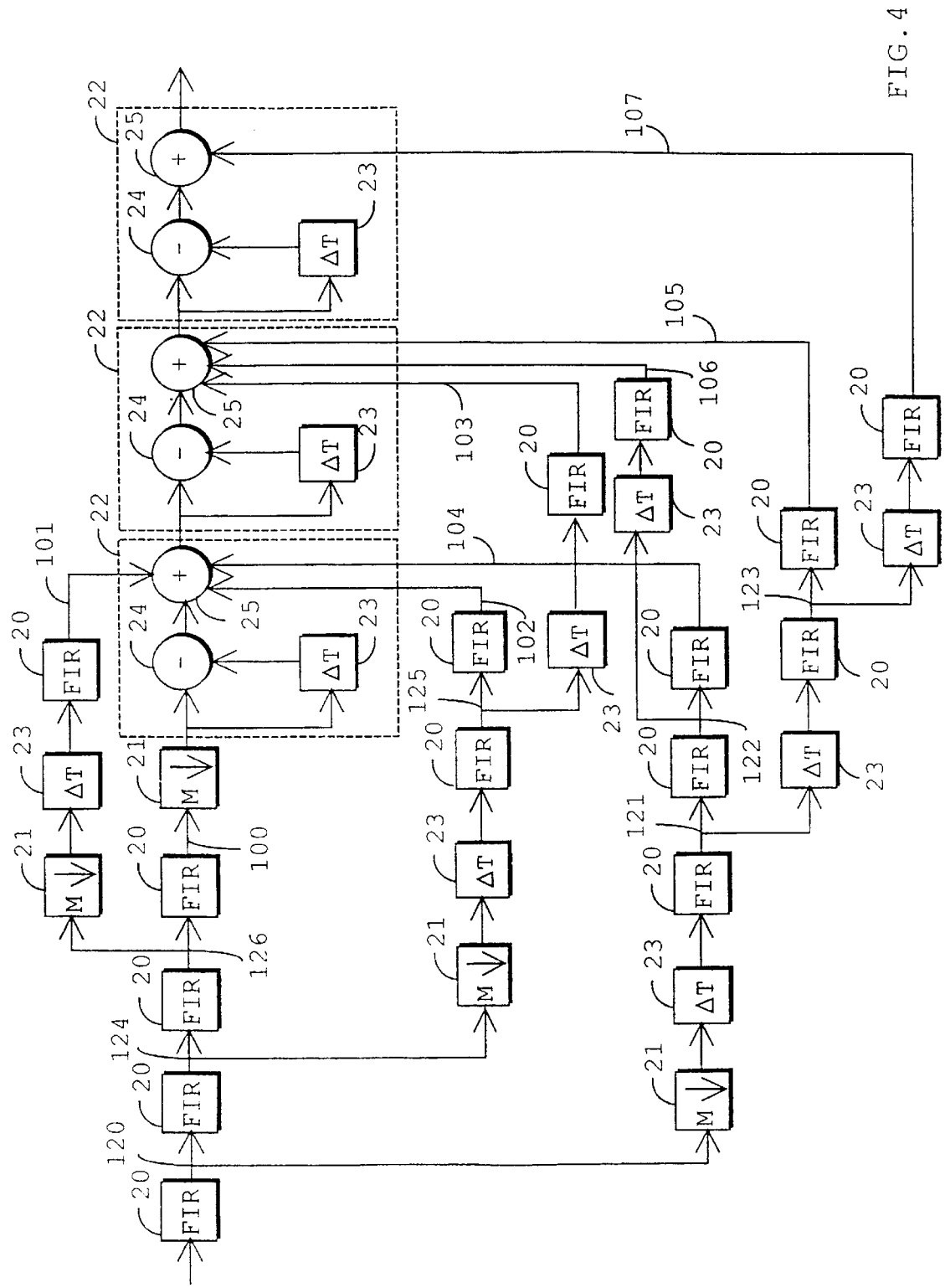
FIG. 4 is a block diagram illustrating a decimation filter of the 4th degree.

FIG. 4 illustrates a decimation filter of the fourth degree of the invention. In this case, the main branch 100 comprises four FIR filters 20, decimation means 21 and three combinations 22 of a comb filter and an adder. Three side branches 101, 102, 103 branch from the divergence points 120, 124, 126 between each of two FIR filters 20 of the main branch 100. Each of the side branches comprises decimation means 21, delay means 23 and one to three FIR filters 20. Additional branches 103, 105, 106, 107 branch from the divergence points 121, 122, 123, 125 between each of two FIR filters of the side branches 101, 102, 103. Each of the additional branches comprises delay means 23 and one to three FIR filters 20.

On the basis of FIGS. 2 to 4 it is possible to deduce the structure of an Nth degree decimation filter of the invented solution. The decimation filter comprises a main branch 100, which comprises decimation means 21, N M-tap FIR filters 20 in sequence before the decimation means 21, which decimate by coefficient M, and N−1 successive combinations 22 of a comb filter and an adder after the decimation means. If the number N of M-tap FIR filters is more than one, in the decimation filter of the invention N−1 sample cycles M preceding the incoming sample cycle M are taken into account in the first additional processing. Thus the main branch of the decimation filter comprises N−1 side branches, the divergence point 120, 124, 126 of which is operationally connected between each of two FIR filters 20 in the main branch 100 and their other end is operationally connected to the adder 25 located in connection with the first comb filter. The side branches comprise decimation means 21 for decimating the sample cycle M coming to the side branch by coefficient M, delay means 23 for delaying the decimated sample cycle by one sample cycle M and a number of successive FIR filters corresponding to the number of FIR filters 20 located between the divergence point and the decimation means of the main branch.

Besides the side branches 102, 104, the structure of the decimation filter comprises additional branches 103, 105, 106, the divergence point 121, 122, 123, 125 of which is operationally connected between each of two successive FIR filters 20 located in the side branch 101, 102, 104 or in the additional branch 103, 105, 106 and their other end is operationally connected to the Pth {P∈[1 , . . . , N−1]} adder 25 in connection with the comb filter after the decimation means 21 of the main branch 100 according to the number P of divergence points involved in forming an additional branch. For example, the additional branch 107 comprises three divergence points 120, 121, 123, and thus the additional branch is connected to the third adder 25 in connection with the comb filter. The additional branches 103, 105, 106, in which the signal is selected for the second additional processing, comprise delay means 23 for delaying the sample cycle which has entered the branch by one sample cycle M, and the number of successive FIR filters 20 corresponds to the number of FIR filters between the divergence point of the side branch 101, 102, 104 or the additional branch 103, 105, 106 and the adder 25 in connection with the comb filter.

Figure 5:
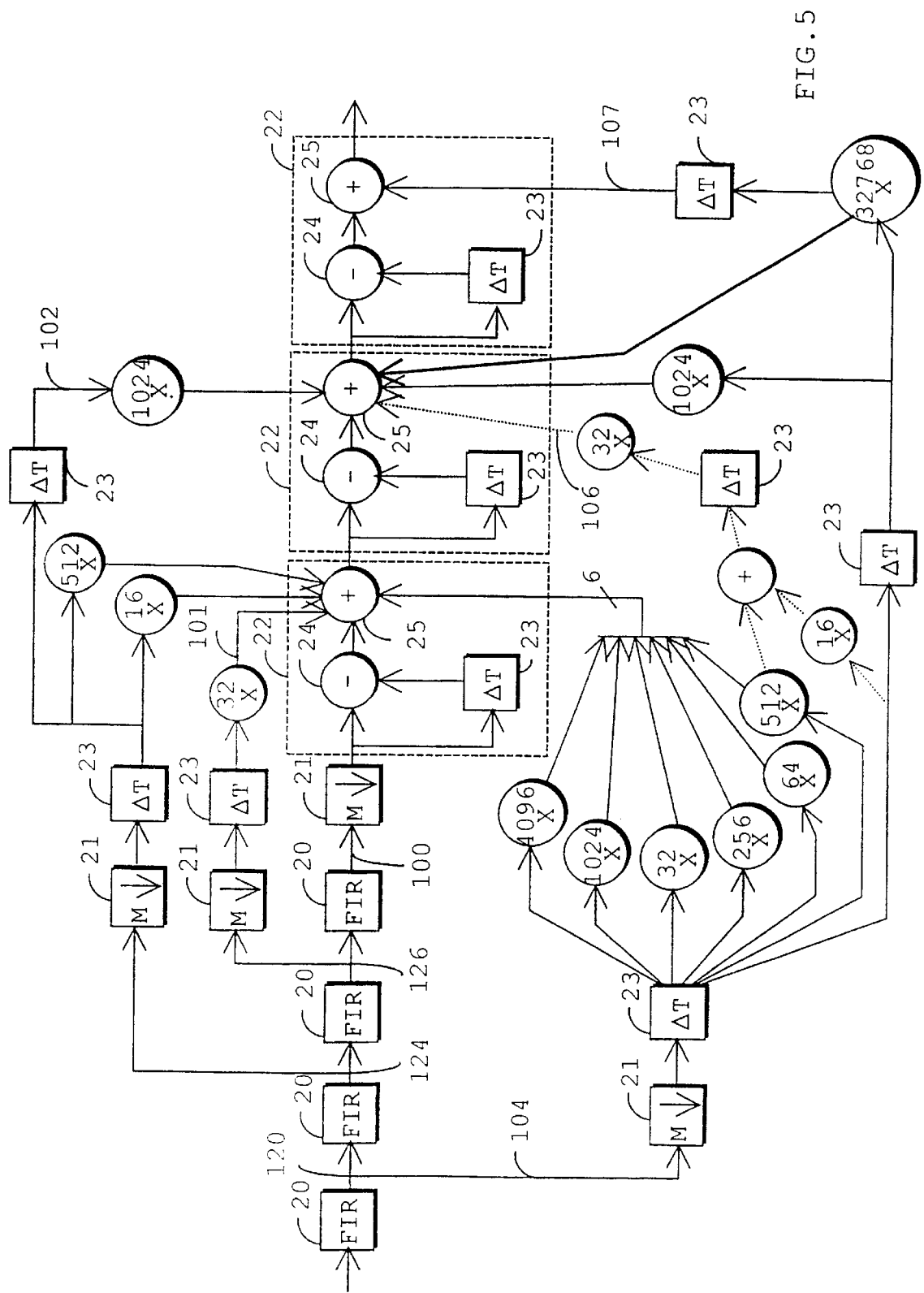
FIG. 5 is a block diagram illustrating a decimation filter of the 4th degree.

FIG. 5 illustrates an embodiment of the invention in which the FIR filters 20 of the additional branches 103, 105, 106 are replaced with means carrying out an operation corresponding to their function. Such an operation is e.g. multiplying. One M-tap FIR filter multiplies the signal by M, two successive M-tap FIR filters multiply the signal by M(M+1)/2, and three or more M-tap FIR filters multiply the signal by a combination of the numbers expressing the number NR (FIR) of FIR filters and the number M of taps as follows:

$$\binom{NR\ (FIR) + M - 1}{M - 1} = \frac{[NR\ (FIR) + M - 1]!}{(M - 1)!\ NR\ (FIR)!}, \quad (3)$$

where ! refers to the factorial operation. FIR filters separated by delay means 23 multiply the signal by $M^{NR(FIR)}$. In the case of FIG. 5 it is assumed that the number of order of the decimation filter is 4 and the number of taps is M=32. Thus the decimated and delayed signal of the side branch 101 is multiplied by 32 and added in the adder 25 in connection with the first comb filter. The signal of the side branch 102 is in turn multiplied by 32*(32+1)=528. Multiplying of the signal can be preferably performed as an arithmetic shift of the bit string to be processed, when the coefficients are powers of two, and this can be carried out if the number of taps is a power of two, i.e. $M=2^k$, k∈[1, 2, 3, . . . ]. For example, expressed as the sum of the powers of two the coefficient of the side branch 102 is 528, i.e. 528=512+16. Furthermore, the additional branch 106 denoted by a broken line and the related adding and multiplying operations are replaced with coefficient 32 768 in the adder 25 in connection with the second comb filter by using the side branch 107. Furthermore, the coefficient 16 896 of the additional branch 105 is replaced with coefficient 1 024 to achieve the correct result in the adder 25 in connection with the second comb filter.

Figure 6:
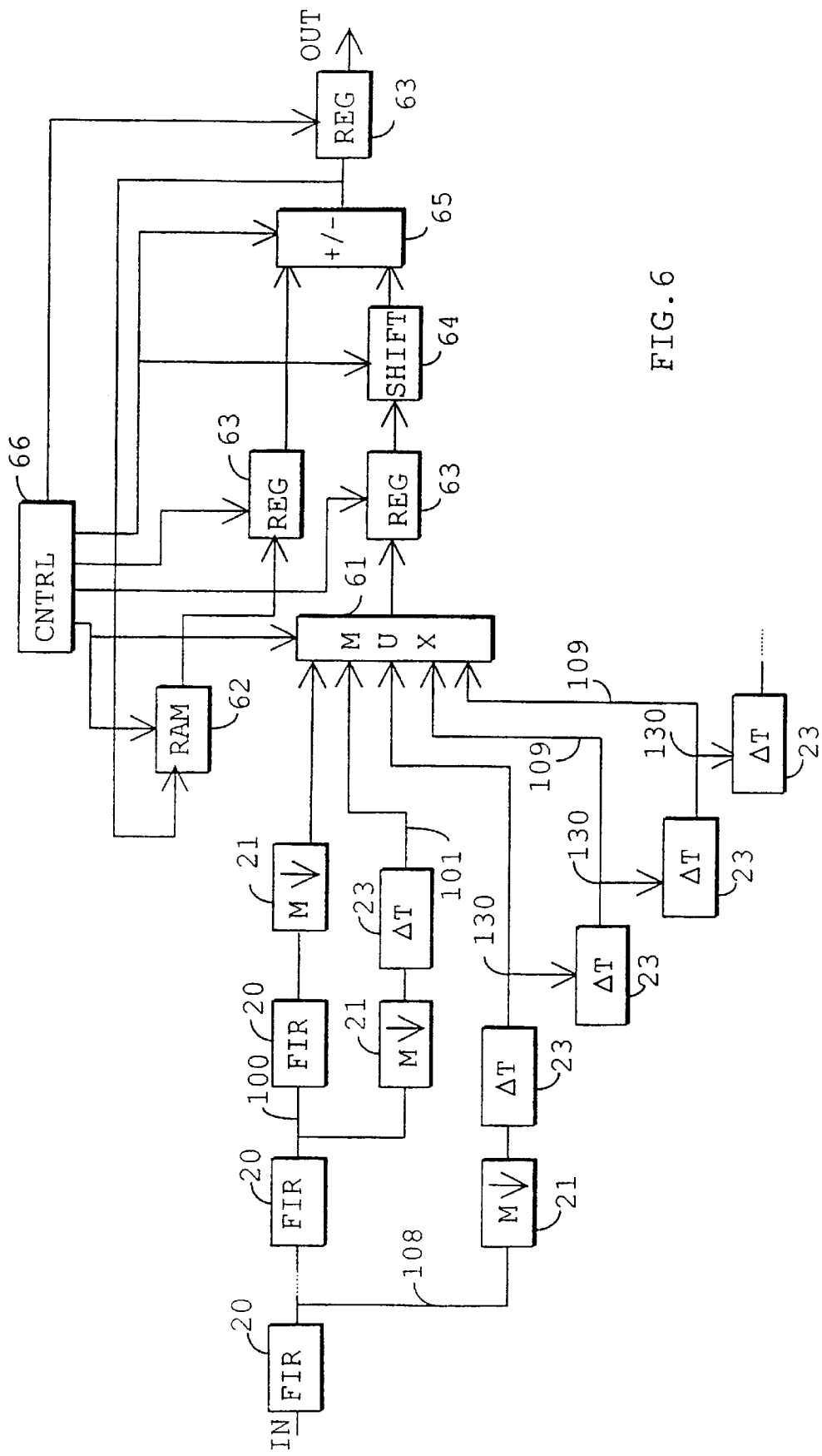
FIG. 6 is a general cycle diagram illustrating a decimation filter.

FIG. 6 illustrates a decimation filter of the Nth degree of the invention. This embodiment is especially preferable when the decimation coefficient M is high. Hence there will be M times fewer samples in the output of the decimation filter than in the input of the decimation filter, whereby a period of time corresponding to M samples will be left for carrying out arithmetic shift operations, adding operations and subtracting operations in connection with the comb filter in serial form. The main branch 100 of the Nth degree decimation filter of the invention, which decimates by coefficient M, comprises N M-tap FIR filters 20 and decimation means 21. Like in the above examples, the decimation filter also comprises side branches and additional branches which do not include multiplying or shifting operations. The decimation filter further comprises selection means 61, a memory 62, registers 63, shift means 64, adder/subtractor means and control means 66. The selection means 61, which preferably is a multiplexer, selects a signal from each main, side or additional branch in turn for the register 63, which functions as a memory for the temporary result. Having left the register 63 the signal enters the shift means 64, in which a necessary arithmetic shift is performed on the bit string of the signal to be processed. The arithmetic shift corresponds to the multiplying/shift operations performed in different branches described in connection with FIGS. 2 to 4. After this, comb-filtering is carried out on the signal to be processed in the means 65, whereby the delayed signal, which has been stored in the memory 62 after a previous processing, is subtracted from the signal. Another alternative is to add the signal of side or additional branches in the means 65 to the signal already processed and stored in the memory 62. Signals from the memory 62, which preferably is the RAM, are preferably stored in the temporary memory 63 before the adding or subtracting operation in the means 65. The results provided by the means 65 are transferred to the memory 62 as long as the results are part of a single decimation process. After all necessary operations have been carried out on one decimation process, the output of the means 65 is transferred to the last register 63, from which the decimation result is forwarded to other processes. The function of the decimation filter is controlled and timed by the control means 66. The control means 66, for example, give information to the memory on the memory location in which the data included in the signal from the means 65 is stored and on the memory location from which the data included in the signal to the means 65 is retrieved.

Although the invention has been described above by means of an example illustrated in the accompanying drawings, it will be obvious that the invention is not limited to it, but may be modified in several ways within the inventive concept disclosed in the appended claims.

What is claimed is:

1. A decimation method the transfer function of which substantially corresponds to the transfer function of a CIC decimation filter, and in which a signal including digital samples is decimated by coefficient M, characterized in that at least main processing is performed on the signal to be decimated, the main processing comprising the steps of performing M-tap FIR filtering N times in sequence, decimating by coefficient M and comb-filtering the signal N−1 times.

2. A method as claimed in claim 1, characterized in that if M-tap FIR filtering is performed in the main processing in sequence more than once {N>1}, a first additional processing is performed on the signal between each of two successive FIR filterings R and R+1{R+1≦N}, the first additional processing comprising the steps of decimating by coefficient M;
delaying the decimated signal by one sample cycle M;
performing FIR filtering on the decimated and delayed signal N−R times; and
adding the FIR filtered signal to the first comb-filtered signal.

3. A method as claimed in claim 2, characterized in that if FIR filtering is performed on the signal decimated and delayed in the first additional processing more than once {N−R>1}, a second additional processing is performed at least once, for which the signal between each of two successive FIR filterings is selected from the first additional processing or from a previous second additional processing, the second additional processing comprising the steps of delaying the signal by one sample cycle M;
performing FIR filtering on the delayed signal as many times as in the first additional processing or in a previous second additional processing after the selection; and
adding the signal to the Pth {P≦N−1} comb-filtered signal according to the number P of delays by sample cycles M.

4. A method as claimed in claim 3, characterized in that in M-tap FIR filtering one is substantially used as the coefficient of taps.

5. A method as claimed in claim 3, characterized in that a power of two is used as the decimation coefficient M.

6. A method as claimed in claim 5, characterized in that FIR filtering of a signal is performed in the first and second additional processing in such a manner that the signal is multiplied by a predefined power of two and/or the signal is multiplied by predefined powers of two and added by multiplying the formed signals.

7. A method as claimed in claim 6, characterized in that multiplying is performed by a logic shift of a signal or by logic shifts of a signal and by adding the logically shifted signals together.

8. A decimation filter the transfer function of which substantially corresponds to the transfer function of a CIC decimation filter, and which is arranged to decimate a signal including digital samples by coefficient M, characterized in that the decimation filter at least comprises a main branch (100), which comprises a decimation means (21), which decimate by coefficient M, N M-tap FIR filters (20) in sequence before the decimation means (21) of the main branch (100), and N−1 combinations (22) of a comb filter and an adder in sequence after the decimation means of the main branch (100).

9. A decimation filter as claimed in claim 8, characterized in that if the number of M-tap FIR filters (20) is more than one, the decimation filter is arranged to take into account N−1 sample cycles M preceding the incoming sample cycle M, and thus the decimation filter comprises besides the main branch (100) N−1 side branches (101, 102, 104), the divergence point (120, 124, 126) of which is operationally connected between each of two FIR filters (20) before the decimation means (21) of the main branch (100) and their other end is operationally connected to an adder (25) in connection with the first comb filter, the side branches comprising decimation means (21) for decimating a signal coming to the side branch by coefficient M;

delay means (23) for delaying the decimated signal by one sample cycle M;

a number of successive FIR filters (20) or means performing an equivalent operation corresponding to the number of FIR filters between the divergence point (120, 124, 126) and the decimation means (21) in the main branch (100).

10. A decimation filter as claimed in claim 9, characterized in that besides the main branch (100) and side branches (101, 102, 104) the decimation filter comprises additional branches (103, 105, 106, 107), the divergence point (121, 122, 123, 125) of which is operationally connected between each of two successive FIR filters (20) in the side branch (101, 102, 104) or in the additional branch (103, 105, 106, 107) or between the means performing an equivalent operation, and their other end is operationally connected to the Pth {P∈[1, . . . , N−1]} adder (25) in connection with the comb filter after the decimation means (21) of the main branch according to the number P of divergence points (120–125) involved in forming an additional branch, the additional branches (103, 105, 106, 107) comprising delay means (23) for delaying the sample cycle entered the additional branch (103, 105, 106, 107) by one sample cycle M;

a number of successive FIR filters (20) or means performing an equivalent operation corresponding to the number of FIR filters between the divergence point (121–125) and the adder (25) in connection with the comb filter in the side branch (101, 102, 104) or in the additional branch (103, 105, 106, 107) where an additional branch branches.

11. A decimation filter the transfer function of which substantially corresponds to the transfer function of a CIC filter and which is arranged to decimate a signal including digital samples by coefficient M, characterized in that the decimation means at least comprises a main branch (100), which comprises decimation means (21), N M-tap FIR filters (20) in sequence before the decimation means (21) of the main branch (100), which decimate by coefficient M; and if the number N of M-tap FIR filters (20) in the main branch (100) is more than one, the decimation filter is arranged to take into account N−1 sample cycles M preceding the incoming sample cycle M, and thus the decimation filter comprises besides the main branch (100)

selection means (61);

memory (61);

shift means (64);

adder/subtractor means (65) and control means (66);

N−1 side branches (101–108), the divergence point (120, 124, 126) of which is operationally connected between each of two FIR filters (20) before the decimation means (21) of the main branch (100) and their other end is operationally connected to the selection means (61), the side branches (101–108) comprising decimation means (21) for decimating the signal entering the side ranch (101–108) by coefficient M;

delay means (23) for delaying the decimated signal by one sample cycle M;

additional branches (109), which comprise delay means (23) for delaying the signal by one sample cycle M, and the divergence point (130) of which is operationally connected after each delay means (23) in the side branch (101–108) or in the additional branch (109) and their other end is operationally connected to the selection means (61); and the selection means (61) of the decimation filter are arranged to select one signal at a time from the main branch (100), side branch (101–108) or the additional branch (109) for an arithmetic shift operation to the shift means (64);

the shift means (64) are arranged to perform a necessary arithmetic shift on each signal of the main branch (100), side branch (101–108) or additional branch (109);

the adder/subtractor means (65) of the decimation filter are arranged to calculate difference of the signals according to comb-filtering and adding the signal of each side branch (101–108) or the additional branch to the result provided;

the memory (62) of the decimation filter is arranged to store the results provided for the signals of each main branch (100), side branch (101–108) and additional branch (109) and the sums of the results;

the control means (66) of the decimation filter are arranged to control the function of the decimation filter so that the decimation filter substantially provides the transfer function of the CIC filter.

12. A decimation filter as claimed in claim 10, characterized in that in M-tap FIR filtering the coefficients of taps are substantially ones.

13. A decimation filter as claimed in claim 10, characterized in that the decimation coefficient is a power of two.

14. A decimation filter as claimed in claim 11, characterized in that in M-tap FIR filtering the coefficients of taps are substantially ones.

15. A decimation filter as claimed in claim 11, characterized in that the decimation coefficient is a power of two.

* * * * *